US012721019B2

(12) United States Patent
Chen et al.

(10) Patent No.: US 12,721,019 B2
(45) Date of Patent: Aug. 25, 2026

(54) LIGHT-EMITTING ELEMENT

(71) Applicant: TAIZHOU GUANYU TECHNOLOGY CO., LTD., Zhejiang Province (CN)

(72) Inventors: Huei-Siou Chen, Taipei City (TW); Li-Chen Wei, Taichung City (TW); Kuo-Cheng Hsu, Taichung City (TW)

(73) Assignee: TAIZHOU GUANYU TECHNOLOGY CO., LTD., Zhejiang Province (CN)

( * ) Notice: Subject to any disclaimer, the term of this patent is extended or adjusted under 35 U.S.C. 154(b) by 562 days.

(21) Appl. No.: 18/317,115

(22) Filed: May 15, 2023

(65) Prior Publication Data

US 2024/0032330 A1 Jan. 25, 2024

(30) Foreign Application Priority Data

Jul. 15, 2022 (CN) ......................... 202210835479.5

(51) Int. Cl.
*H10K 59/80* (2023.01)
*H10K 59/122* (2023.01)
*H10K 71/16* (2023.01)

(52) U.S. Cl.
CPC ......... *H10K 59/8792* (2023.02); *H10K 71/16* (2023.02); *H10K 59/122* (2023.02)

(58) Field of Classification Search
CPC ......................... H10K 59/122; H10K 59/8792
See application file for complete search history.

(56) References Cited

U.S. PATENT DOCUMENTS

2005/0179368 A1* 8/2005 Ryu .................. H10K 59/8792 313/506
2021/0328199 A1* 10/2021 Yao ..................... H10K 59/122
2022/0130915 A1 4/2022 Son et al.

FOREIGN PATENT DOCUMENTS

| CN | 1953238 A | 4/2007 |
|---|---|---|
| CN | 112420951 A | 2/2021 |
| CN | 112885872 A | 6/2021 |
| CN | 114105955 A | 3/2022 |
| JP | 2005209651 A | 8/2005 |

(Continued)

OTHER PUBLICATIONS

English Abstract of KR 20080003109 A.

(Continued)

*Primary Examiner* — Daniel P Shook
(74) *Attorney, Agent, or Firm* — WPAT LAW; Anthony King

(57) ABSTRACT

A light-emitting element comprises a substrate, a light shielding layer, a capping layer and a plurality of protrusions. The light shielding layer is above the substrate. The capping layer is above the light shielding layers. The plurality of protrusions is arranged over the substrate, an organic light-emitting unit comprising an organic material being disposed between two adjacent protrusions of the plurality of protrusions. An edge of the light shielding layer is misaligned with an edge of one of the plurality of protrusions. The organic light-emitting unit includes a first light-emitting unit and a second light-emitting unit. The first light-emitting unit and the second light-emitting unit respectively have an organic light-emitting stack layer comprising an organic material.

13 Claims, 14 Drawing Sheets

(56) References Cited

FOREIGN PATENT DOCUMENTS

| | | | |
|---|---|---|---|
| JP | 2010118273 | A | 5/2010 |
| JP | 2011119091 | A | 6/2011 |
| JP | 2014045184 | A | 3/2014 |
| JP | 2015015194 | A | 1/2015 |
| KR | 20080003109 | A | 1/2008 |
| KR | 20100054084 | A | 5/2010 |
| KR | 20170015601 | A | 2/2017 |
| KR | 20170040180 | A | 4/2017 |
| TW | 201028036 | A | 7/2010 |
| TW | 201742240 | A | 12/2017 |
| WO | 2017043516 | A1 | 3/2017 |

OTHER PUBLICATIONS

Extended Search report from the European Patent Office of EP patent application 23174296.6 dated Jan. 12, 2023.

Office Action, Cited References and Search Report dated Dec. 2, 2024 issued by the European Patent Office for the EP Counterpart Application No. 23 174 296.6-1211.

Office Action, Cited References and Search Report dated Dec. 3, 2024 issued by the Japan Patent Office for the Japan Counterpart Application No. 2023-081807.

English Abstract Translation of CN112420951A.

Office Action, Cited References and Search Report dated May 31, 2024 issued by the Taiwan Intellectual Property Office for the Taiwan Counterpart Application No. 112117972.

Office Action, Cited References and Search Report dated May 28, 2024 issued by the Japan Patent Office for the Japan Counterpart Application No. 2023-081807.

* cited by examiner

LIGHT-EMITTING ELEMENT

FIELD OF THE PRESENT DISCLOSURE

The present disclosure relates to a light-emitting element and, in particular, to an organic light-emitting element.

DESCRIPTION OF THE PRIOR ART

The organic light emitting display (OLED) has been widely used in the most high-end electronic elements. However, due to the limitations of the prior art, the luminous effect of the luminescent material in the OLED cannot be effectively controlled, resulting in problems such as halo and optical crosstalk, and the optical effect of the OLED is not as expected. In the prior art, sometimes additional polarizers are added to improve the above problems, but the halo cannot be effectively eliminated, and the additional polarizers have disadvantages such as increasing the thickness of the display and high cost. The present disclosure provides a device that can solve the above-mentioned dilemma.

SUMMARY OF THE PRESENT DISCLOSURE

A light-emitting element is provided in the present disclosure. The light-emitting element comprises a substrate, a light shielding layer, a capping layer and a plurality of protrusions. The light shielding layer is disposed over the substrate. The capping layer is disposed over the light shielding layers. The plurality of protrusions is arranged over the substrate, an organic light-emitting unit comprising an organic material being disposed between two adjacent protrusions of the plurality of protrusions. An edge of the light shielding layer is misaligned with an edge of one of the plurality of protrusions. The organic light-emitting unit includes a first light-emitting unit and a second light-emitting unit. The first light-emitting unit and the second light-emitting unit respectively have an organic light-emitting stack layer comprising the organic material.

In some embodiments, the organic light-emitting material includes a molecular structure with a resonance structure and can be selected from the group consisting of a spiro-triarylamine, a bis-triarylamine and a combination thereof.

In some embodiments, the first light-emitting unit and the second light-emitting unit each have an effective light-emitting area whose size is defined by an anode located under each light-emitting unit. Each light-emitting unit has a black area and a bright area when emitting light, wherein a total area of the black area is less than 50% of the effective light-emitting area.

In some embodiments, the light shielding layer is electrically insulated from a conductive layer disposed on the capping layer by the capping layer.

In some embodiments, the organic light-emitting stack layer includes: a carrier injection layer, a carrier transport layer, an organic emission layer and an organic carrier transport layer.

In some embodiments, the plurality of protrusions comprises a photosensitive material.

In some embodiments, the substrate comprises a transparent material.

In the present disclosure, a light-emitting element is provided. The light-emitting element comprises a substrate, a plurality of light shielding layers, a capping layer, a conductive layer and a plurality of protrusions. The plurality of light shielding layers is disposed over the substrate. The capping layer is disposed over the substrate and covers the plurality of light shielding layers. The conductive layer is disposed over the capping layer. The plurality of protrusions is disposed over a portion of the conductive layer, an organic light-emitting unit comprising an organic material being disposed between two adjacent protrusions of the plurality of protrusions. Each of the plurality of protrusions has an edge, which is offset from an edge of one of the plurality of light shielding layers in the longitudinal direction.

In some embodiments, an area of the light shielding layer is larger than an area of each of the plurality of protrusions in the lateral direction.

In some embodiments, the conductive layer includes a transparent conductive film, and the transparent conductive film includes ITO (indium tin oxide), IZO (indium zinc oxide) or IGZO (indium gallium zinc oxide).

In some embodiments, the conductive layer includes an anode electrode.

In some embodiments, a distance between respective edges of the two adjacent protrusions of the organic light-emitting unit is greater than a distance between two of the plurality of light shielding layers.

In some embodiments, the capping layer is formed on the plurality of light shielding layers by one of chemical vapor deposition (CVD), physical vapor deposition (PVD) and spin-on-glass (SOG) spin coating.

DETAILED DESCRIPTION OF THE EMBODIMENTS

Figure 1:
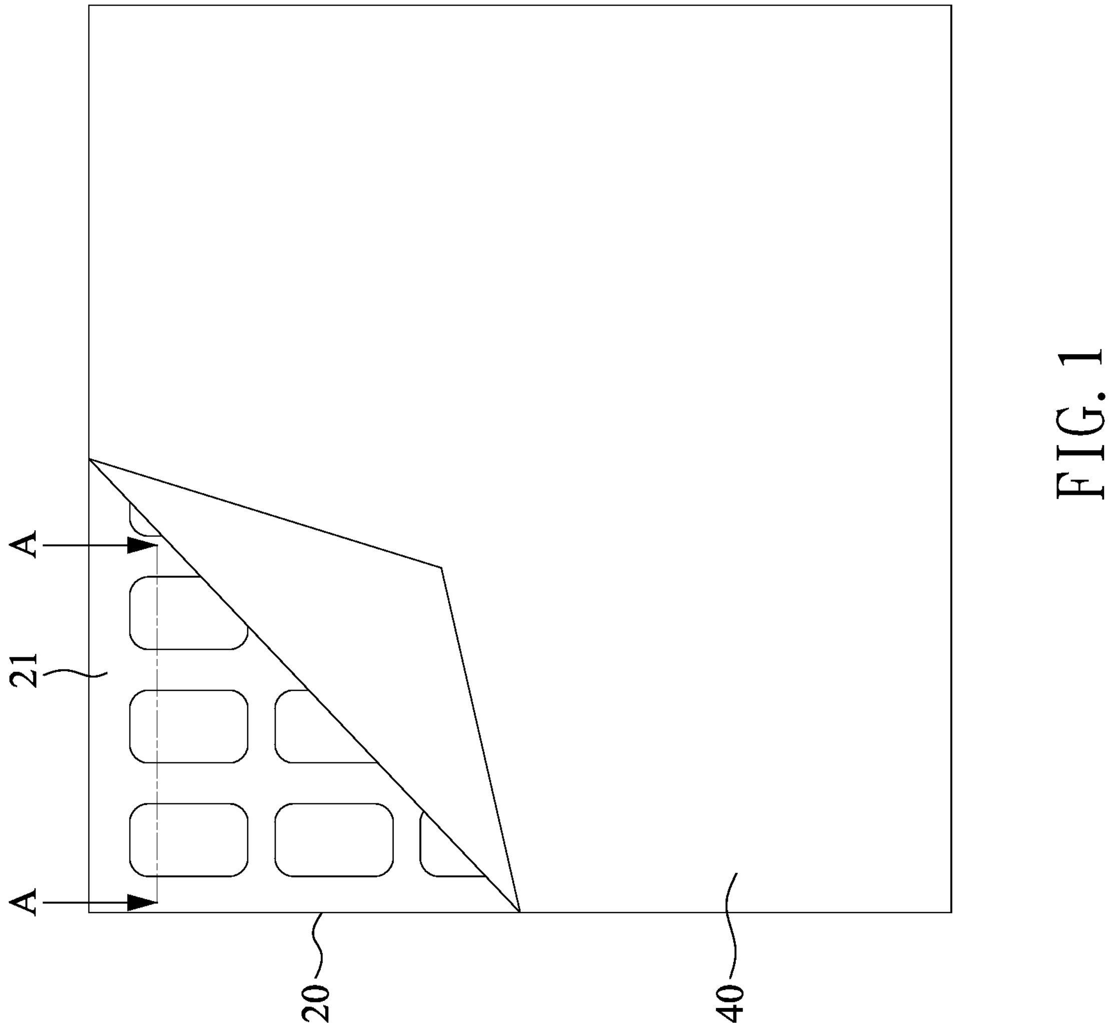
FIG. 1 is a top view illustrating an intermediate product of a light-emitting element.

FIG. 1 is a top view illustrating an intermediate product of a light-emitting element 10. The light-emitting element 10 has a light-emitting layer 20 and a capping layer 40 disposed over the light-emitting layer 20. For the light-emitting layer 20, a spacer 21 can be designed to provide an array of recesses for accommodating an array of light-emitting pixels. In some embodiments, the spacer 21 may comprise a photosensitive material.

Figure 2:
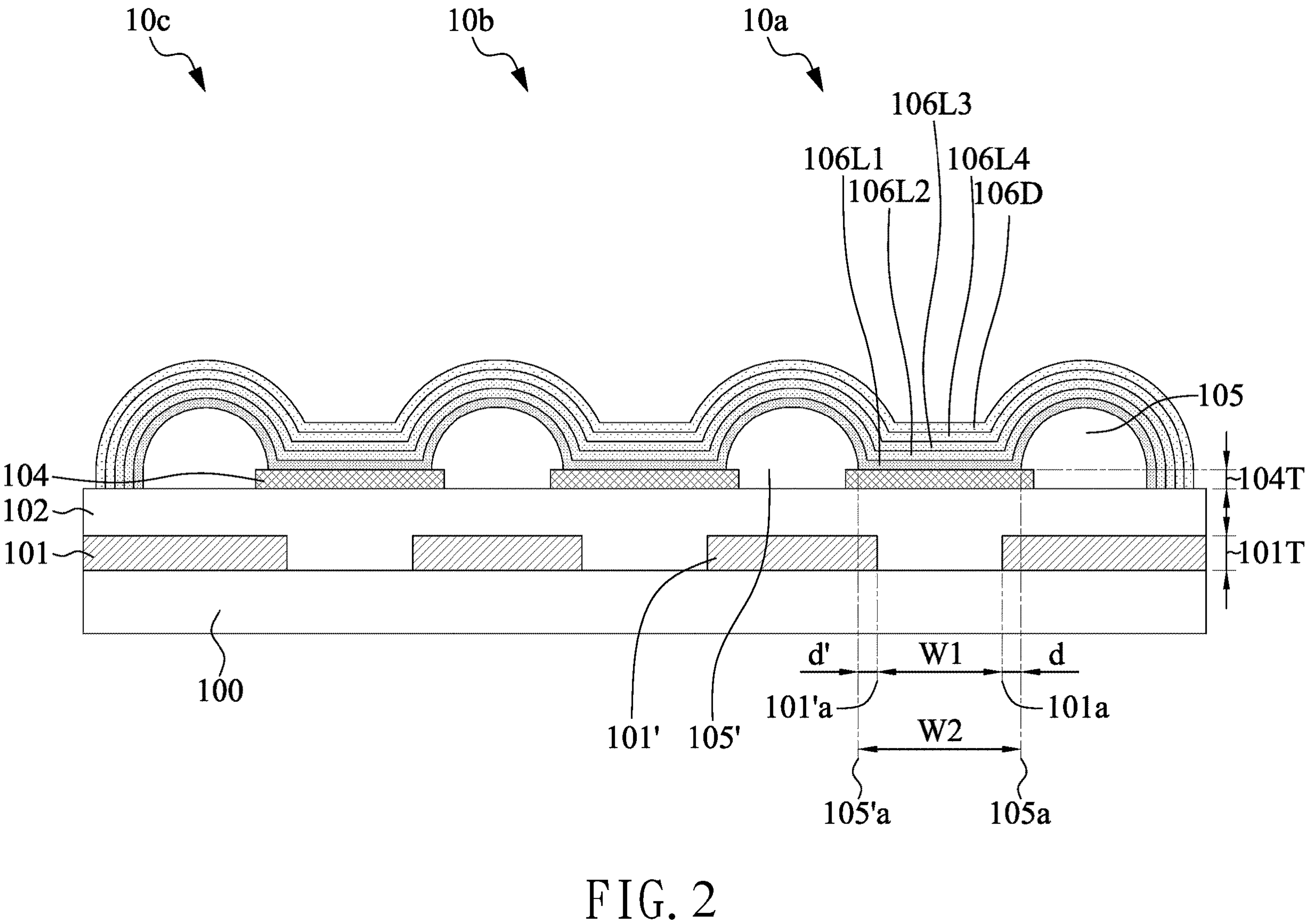
FIG. 2 is an illustration of a cross-sectional view along line AA in FIG. 1.

FIG. 2 is an illustration of a cross-sectional view along line AA in FIG. 1 and illustrates only a light-emitting region. For simplicity, the covering layer 40 is omitted here. The spacer 21 has a plurality of protrusions 105 to define a light-emitting pixel pattern. A recess is located between two adjacent protrusions 105 and provides a space for accommodating a light-emitting pixel. Those skilled in the art should understand that from the cross-sectional view, the protrusions 105 are depicted as disconnected, but from the top view of FIG. 1, they can be connected to one another through other portions of the spacer 21.

The light-emitting element 10 includes a light-emitting array, which includes a first organic light-emitting unit 10*a*, a second organic light-emitting unit 10*b* and a third organic light-emitting unit 10*c*. The organic light-emitting unit may also be referred to as a light-emitting pixel herein. In some embodiments, the light-emitting unit 10*a* includes a first electrode 104, a carrier injection layer 106L1 above the protrusion 105 and the first electrode 104, a carrier transport layer 106L2 above the carrier injection layer 106L1, an organic emission layer 106L3 above a portion of the carrier transport layer 106L2 and an organic carrier transport layer 106L4 above the organic emission layer 106L3. The carrier injection layer 106L1, the carrier transport layer 106L2, the organic emission layer 106L3 and the organic carrier transport layer 106L4 may be collectively referred to as an organic light-emitting stack layer.

In some embodiments, the carrier injection layer 106L1 is arranged between the first electrode 104 and the carrier transport layer 106L2. The light-emitting unit 10*a* includes an organic material, which can be placed in any one of the carrier transport layer, the carrier injection layer or the organic emission layer in the light-emitting unit 10*a* according to different implementations. Further, in some embodiments, the organic material has an absorption rate of greater than or equal to 50% for a specific wavelength. In some embodiments, the organic material has an absorption rate of greater than or equal to 60% for a specific wavelength. In some embodiments, the organic material has an absorption rate of greater than or equal to 70% for a specific wavelength. In some embodiments, the organic material has an absorption rate of greater than or equal to 80% for a specific wavelength. In some embodiments, the organic material has an absorption rate of greater than or equal to 90% for a specific wavelength. In some embodiments, the organic material has an absorption rate of greater than or equal to 95% for a specific wavelength.

In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

The substrate 100 is located under the light-emitting layer 20. In some embodiments, the substrate 100 may include a thin film transistor (TFT) array. In some embodiments, the substrate 100 includes a base (not shown), a dielectric layer (not shown) and one or more circuits (not shown) disposed on or in the base. In some embodiments, the base is a transparent base, or is at least partially transparent. In some embodiments, the base is a non-flexible base, and the material of the base may include glass, quartz, low temperature poly-silicon (LTPS) or other suitable materials. In some embodiments, the base is a flexible base, and the material of the base may include transparent epoxy resin, polyimide, polyvinyl chloride, methyl methacrylate or other suitable materials. The dielectric layer may be disposed on the base as needed. In some embodiments, the dielectric layer may include silicon oxide, silicon nitride, silicon oxynitride or other suitable materials.

In some embodiments, the circuit may comprise a complementary metal-oxide-semiconductor (CMOS) circuit, or comprise a plurality of transistors and a plurality of capacitors adjacent to the transistors, wherein the transistors and capacitors are formed on the dielectric layer. In some embodiments, the transistor is a thin-film transistor (TFT). Each transistor includes source/drain regions (including at least one source region and a drain region), a channel region between the source/drain regions, a gate electrode disposed above the channel region, and a gate insulator between the channel region and the gate electrode. The channel region of the transistor may be made of a semiconductor material, such as silicon or other elements selected from Group IV or Group III and Group V.

A plurality of light shielding layers 101 is formed over the substrate 100. The plurality of light shielding layers 101 is in contact with the substrate 100. The plurality of light shielding layers 101 is separated from one another by a distance W1. The plurality of light shielding layers 101 can absorb more than 90% of visible light. In some embodiments, the light shielding layer 101 may comprise a black body material. In some embodiments, the light shielding layer 101 includes a layer of a single material. In some embodiments, the light shielding layer 101 includes a composite layer formed of a plurality of materials. In some embodiments, the light shielding layer 101 includes an organic material. In some embodiments, the light shielding layer 101 includes an inorganic material.

The capping layer 102 is formed over the substrate 100 and covers the plurality of light shielding layers 101. The capping layer 102 is formed in the gaps between the plurality of light shielding layers 101. The capping layer 102 covers the upper surface and two side surfaces of the light shielding layer 101.

A plurality of first electrodes 104 is formed on the capping layer 102. The plurality of first electrodes 104 is separated from one another. The plurality of first electrodes 104 is in contact with the capping layer 102. The plurality of first electrodes 104 is electrically connected to the substrate 100.

As shown in FIG. 2, a plurality of protrusions 105 is formed on part of the upper surface of the first electrode 104. The peripheral area of the first electrode 104 is covered by the protrusion 105. In some embodiments, the edge corners of the first electrode 104 are completely surrounded by the protrusion 105. In some embodiments, the sidewall of the first electrode 104 is completely in contact with the protrusion 105. In some embodiments, the protrusions 105 in the gaps between two first electrodes 104 are separated from each other. The light shielding layer 101 is electrically insulated from the first electrode 104 disposed on the capping layer 102 through the capping layer 102.

In this case, the first electrode 104 may be an anode. The first electrode 104 of the light-emitting unit 10*a* can define the size of the effective light-emitting area. In some examples, the light-emitting unit 10*a* has a black area and a bright area when emitting light. The total area of the black area is less than 50% of the effective light-emitting area. The effective light-emitting area can also be called the effective illumination area.

In some embodiments, the effective illumination area has a width of at least less than 10 microns. In some embodiments, the effective illumination area has a width of about 3 microns to 6 microns. In some embodiments, the effective illumination area has a width of about 4 microns to 6 microns. The effective illumination area determines the pixel size of the light-emitting element 10 in FIG. 1. Since the size of the effective illumination area can be controlled below 10 microns, the pixel density of the light-emitting element 10 can exceed 1000 or 2000 ppi.

In FIG. 2, the light shielding layer 101 has a thickness 101T. The first electrode 104 has a thickness 104T. In some embodiments, the thickness 101T of the light shielding layer 101 is greater than the thickness 104T of the first electrode 104. In some embodiments, the thickness 101T of the light shielding layer 101 is equal to the thickness 104T of the first electrode 104. In some embodiments, the thickness 101T of the light shielding layer 101 is less than the thickness 104T of the first electrode 104.

The first electrode 104 may have a total thickness of about 1500 Å to about 2700 Å. In some embodiments, the first electrode 104 has a total thickness of about 1800 Å to about 2200 Å. In some embodiments, the first electrode 104 has a total thickness of about 2000 Å. The first electrode 104 can be an electrically conductive layer. The first electrode 104 may comprise ITO, IZO, IGZO, AlCu alloy, AgMo alloy, about 50 Å to 500 Å ITO (or IZO or IGZO) and 500 Å to 2000 Å metal film (Ag, Al, Mg, Au) and about 50 Å to 1000 Å ITO (or IZO or IGZO).

In some embodiments, the electrode 104 is a composite structure. For example, the electrode 104 has a conductive film and a transparent conductive film located thereon. The conductive film is located between the transparent conductive film and the substrate 100. In some embodiments, the conductive film includes aluminum, gold, silver, copper, or the like. In some embodiments, the transparent conductive film includes indium, tin, graphene, zinc, oxygen, and the like. In some embodiments, the electrode 104 includes a transparent conductive thin film. In some embodiments, the electrode 104 includes ITO (indium tin oxide). In some embodiments, the electrode 104 includes IZO (indium zinc oxide). In some embodiments, the electrode 104 includes IGZO (indium gallium zinc oxide). In some embodiments, a roughness Ra of the transparent conductive film is less than 10 Å. A thickness of the conductive film may range from about 1500 Å to about 3000 Å. A thickness of the transparent conductive film may be between about 80 Å and about 1000 Å.

In some embodiments, the first electrode 104 has at least three different films. A conductive film (such as Al, Cu, Ag, Au, etc.) is sandwiched between two transparent conductive films. In some circumstances, one of the two transparent conductive films is ITO, one side of which is in contact with the substrate 100 and the other side is in contact with the conductive film. In some circumstances, one of the two transparent conductive films is ITO, one side of which is in contact with the conductive film and the other side is in contact with the protrusion 105 or the light-emitting material.

In some embodiments, each protrusion 105 has a curved surface protruding away from the substrate 100 and covering a peripheral area of the first electrode 104. The protrusions 105 can be of different shapes. In some embodiments, the protrusion 105 has a curved surface. In some embodiments, the protrusion 105 is trapezoidal in shape. In some embodiments, the protrusion 105 is rectangular in shape. The pattern of the protrusion 105 is designed according to the pixel arrangement, and the patterned protrusion 105 may be called a pixel defined layer (PDL). The protrusions 105 are arranged over the substrate 100. Each protrusion 105 fills the gap between two adjacent first electrodes 104. Each first electrode 104 is partially covered by a protrusion 105. The protrusions 105 may include the photosensitive material. In FIG. 2, the area of the light shielding layers 101 is larger than the area of each of the protrusions 105 in the lateral direction.

The protrusion 105 has an edge 105*a* that covers on an upper surface of the first electrode 104. The light shielding layer 101 has an edge 101*a* near the center of the first electrode 104. The edge 101*a* of the light shielding layer 101 is not aligned with the edge 105*a* of the protrusion 105. There is an offset d between the edge 105*a* of the protrusion 105 and the edge 101*a* of the light shielding layer. The percentage of the offset d to the width of the light shielding layer 101 may be greater than or equal to 10%. The percentage of the offset d to the width of the light shielding layer 101 may be greater than or equal to 20%. The percentage of the offset d to the width of the light shielding layer 101 may be greater than or equal to 30%. The percentage of the offset d to the width of the light shielding layer 101 may be greater than or equal to 40%.

The protrusion 105' has an edge 105'*a* that covers on the upper surface of the first electrode 104. The light shielding layer 101' has an edge 101'*a* near the center of the first electrode 104. There is an offset d' between the edge 105'*a* of the protrusion 105' and the edge 101'*a* of the light shielding layer. The percentage of the offset d' to the width of the light shielding layer 101' may be greater than or equal to 10%. The percentage of the offset d' to the width of the light shielding layer 101' may be greater than or equal to 20%. The percentage of the offset d' to the width of the light shielding layer 101' may be greater than or equal to 30%. The percentage of the offset d' to the width of the light shielding layer 101' may be greater than or equal to 40%. In some embodiments, the offset d is equal to the offset d'. In some embodiments, the offset d is greater than the offset d'. In some embodiments, the offset d is less than the offset d'.

In FIG. 2, the distance between the plurality of light shielding layers 101 and 101' is W1, and the distance between the respective edges 105*a* and 105'*a* of two adjacent protrusions 105 and 105' is W2. Due to the offset d and d', the distance W2 between the respective edges 105*a* and 105'*a* of two adjacent protrusions 105 and 105' is greater than the distance W1 between the plurality of light shielding layers 101 and 101'. In FIG. 2, the distance W2 between the respective edges 105*a* and 105'*a* of two adjacent protrusions 105 and 105' may be the sum of the distance W1 between the two light shielding layers 101 and 101' among the plurality of light shielding layers 101, the offset d and the offset d'. The distance W2 between the respective edges 105*a* and 105'*a* of two adjacent protrusions 105 and 105' can define the area of the effective light-emitting region. Because the distance W1 between the plurality of light shielding layers 101 and 101' is less than W2, the plurality of light shielding layers 101 and 101' can control the light emitted by the first electrode 104, thereby improving the imaging effect of the pattern.

In addition, since the light shielding layer 101 can shield the ambient light going upward from the substrate 100, it can reduce the optical cross talk between the ambient light and the light emitted by the light-emitting unit 10*a*. In other words, because the light-shielding layer 101 can absorb more than 90% of the ambient light traveling upward from the substrate 100, it can reduce the optical cross talk between the ambient light and the light emitted by the light-emitting unit 10*a*.

In some embodiments, the absorption rate of the protrusion 105 for a specific wavelength is greater than or equal to 50%. In some embodiments, the absorption rate of the protrusion 105 for a specific wavelength is greater than or equal to 60%. In some embodiments, the absorption rate of the protrusion 105 for a specific wavelength is greater than or equal to 70%. In some embodiments, the absorption rate of the protrusion 105 for a specific wavelength is greater than or equal to 80%. In some embodiments, the absorption rate of the protrusion 105 for a specific wavelength is greater than or equal to 90%. In some embodiments, the absorption rate of the protrusion 105 for a specific wavelength is greater than or equal to 95%. In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

The carrier injection layer 106L1 is disposed on the exposed surfaces of the capping layer 102, the protrusion 105 and the first electrode 104. The carrier injection layer 106L1 continuously covers the exposed surfaces of the protrusion 105 and the first electrode 104. In some embodiments, the exposed surface of each first electrode 104 is configured for an effective light-emitting area of one light-emitting unit 10*a*. Optionally, the carrier injection layer 106L1 is in contact with the protrusion 105. In some embodiments, the carrier injection layer 106L1 is in contact with the first electrode 104. In some embodiments, the carrier injection layer 106L1 is an organism. In some embodiments, the carrier injection layer 106L1 is configured to perform hole injection. In some embodiments, the carrier injection layer 106L1 is a hole injection layer. In some embodiments, the carrier injection layer 106L1 may have a thickness of about 80 Å to about 500 Å.

The carrier transport layer 106L2 is disposed on the exposed surfaces of the capping layer 102, the protrusion 105 and the first electrode 104. The carrier transport layer 106L2 is disposed above the carrier injection layer 106L1 and completely covers the carrier injection layer 106L1. The carrier injection layer 106L1 is disposed under the carrier transport layer 106L2. The carrier transport layer 106L2 continuously covers the carrier injection layer 106L1. The carrier transport layer 106L2 covers the plurality of protrusions 105 and the plurality of first electrodes 104. Optionally, the carrier transport layer 106L2 is in contact with the carrier injection layer 106L1. In some embodiments, the carrier transport layer 106L2 is an organism. In some embodiments, carrier transport layer 106L2 is configured to perform hole transport. In some embodiments, the carrier transport layer 106L2 is a first hole transport layer. In some embodiments, the carrier injection layer 106L1 may have a thickness of about 80 Å to about 500 Å.

The organic emission layer 106L3 is disposed on the exposed surfaces of the capping layer 102, the protrusion 105 and the first electrode 104. The organic emission layer 106L3 is disposed above the carrier transport layer 106L2 and completely covers the carrier transport layer 106L2. The carrier transport layer 106L2 is disposed under the organic emission layer 106L3. The organic emission layer 106L3 continuously covers the carrier transport layer 106L2. The organic emission layer 106L3 covers the plurality of protrusions 105 and the plurality of first electrodes 104. Optionally, the organic emission layer 106L3 is in contact with the carrier transport layer 106L2. The organic emission layer 106L3 is configured to emit a first color.

In some embodiments, the absorption rate of the organic emission layer 106L3 for a specific wavelength is greater than or equal to 50%. In some embodiments, the absorption rate of the organic emission layer 106L3 for a specific wavelength is greater than or equal to 60%. In some embodiments, the absorption rate of the organic emission layer 106L3 for a specific wavelength is greater than or equal to 70%. In some embodiments, the absorption rate of the organic emission layer 106L3 for a specific wavelength is greater than or equal to 80%. In some embodiments, the absorption rate of the organic emission layer 106L3 for a specific wavelength is greater than or equal to 90%. In some embodiments, the absorption rate of the organic emission layer 106L3 for a specific wavelength is greater than or equal to 95%. In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

In some embodiments, at least one of the carrier transport layer 106L2 and the organic emission layer 106L3 includes an organic material. The organic material may include a molecular structure having a resonance structure. The organic material may be selected from the group consisting of a spiro-triarylamine, a bis-triarylamine and a combination thereof. In some embodiments, at least one of the carrier transport layer 106L2 and the organic emission layer 106L3 includes the spiro-triarylamine. In some embodiments, at least one of the carrier transport layer 106L2 and the organic emission layer 106L3 includes the bis-triarylamine. In some embodiments, the carrier transport layer 106L2 and the organic emission layer 106L3 comprise the same material. In some embodiments, the carrier transport layer 106L2 includes

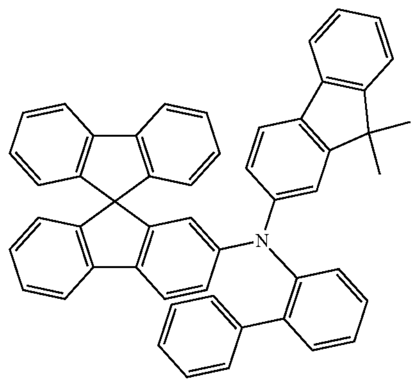 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

and the organic emission layer 106L3 includes

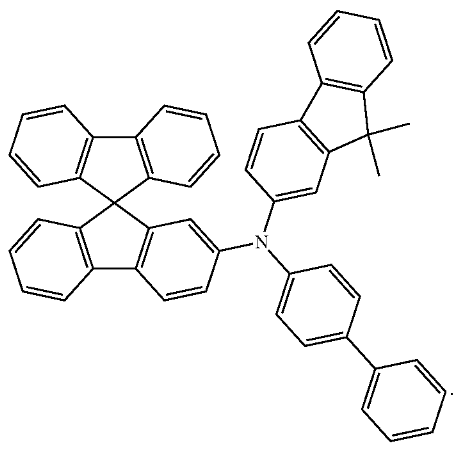 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

In some embodiments, the carrier transport layer 106L2 includes

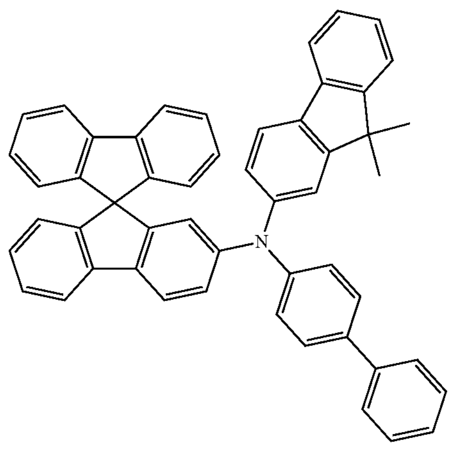 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

and the organic emission layer 106L3 includes

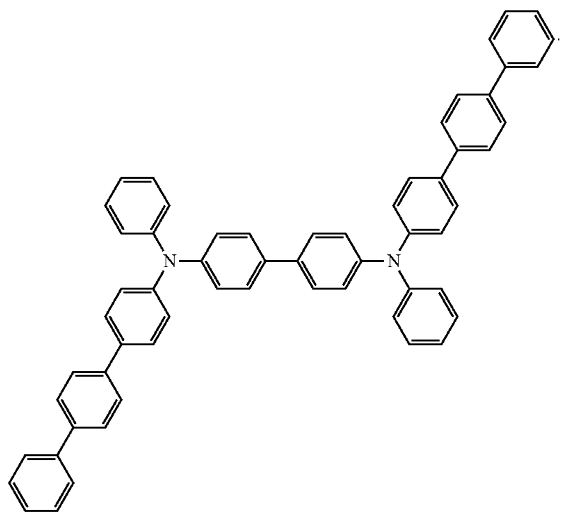 [SMILES: c1ccc(-c2ccc(-c3ccc(N(c4ccccc4)c4ccc(-c5ccc(N(c6ccccc6)c6ccc(-c7ccc(-c8ccccc8)cc7)cc6)cc5)cc4)cc3)cc2)cc1]

The organic carrier transport layer 106L4 is disposed on the exposed surfaces of the capping layer 102, the protrusion 105 and the first electrode 104. The organic carrier transport layer 106L4 is disposed on the organic emission layer 106L3 and completely covers the organic emission layer 106L3. The organic emission layer 106L3 is disposed under the organic carrier transport layer 106L4. The organic carrier transport layer 106L4 continuously covers the organic emission layer 106L3. The organic carrier transport layer 106L4 covers the plurality of protrusions 105 and the plurality of first electrodes 104. Optionally, the organic carrier transport layer 106L4 is in contact with the organic emission layer 106L3.

The second electrode 106D is disposed on the exposed surfaces of the capping layer 102, the protrusion 105 and the first electrode 104. The second electrode 106D is located above the organic carrier transport layer 106L4 and completely covers the organic carrier transport layer 106L4. In some circumstances, the second electrode 106D is patterned to cover only the effective light-emitting area of each light-emitting pixel. In some circumstances, the second electrode 106D is in contact with the organic carrier transport layer 106L4.

The second electrode 106D may have a thickness of about 80 Å to about 500 Å. In some embodiments, the second electrode 106D may have a thickness of about 80 Å to about 150 Å. In some embodiments, the second electrode 106D may have a thickness of about 150 Å to about 200 Å. In some embodiments, the second electrode 106D may have a thickness of about 200 Å to about 300 Å. In some embodiments, the second electrode 106D may have a thickness of about 300 Å to about 400 Å. In some embodiments, the second electrode 106D may have a thickness of about 400 Å to about 500 Å.

In this case, the second electrode 106D may be a cathode. The second electrode 106D can be a metal material, such as Ag, Mg and the like. In some embodiments, the second electrode 106D includes ITO (indium tin oxide) or IZO (indium zinc oxide).

In some embodiments, the second electrode 106D is a composite structure. For example, the second electrode 106D has a conductive film and a transparent conductive film thereon. The conductive film is located between the transparent conductive film and the organic carrier transport layer 106L4. In some embodiments, the conductive film includes aluminum, gold, silver, copper, magnesium, molybdenum, and the like. In some embodiments, the transparent conductive film includes indium, tin, graphene, zinc, oxygen, and the like. In some embodiments, the transparent conductive film is ITO (indium tin oxide). In some embodiments, the transparent conductive film is IZO (indium zinc oxide). In some embodiments, the transparent conductive film is located between the conductive film and the organic carrier transport layer 106L4.

In FIG. 2, the light-emitting element 10 includes a substrate 100, a plurality of protrusions 105 on the substrate 100 and a plurality of light-emitting units separated by the protrusions 105.

These light-emitting units include a first light-emitting unit 10*a*, a second light-emitting unit 10*b* and a third light-emitting unit 10*c*. In some embodiments, the first light-emitting unit 10*a*, the second light-emitting unit 10*b* and the third light-emitting unit 10*c* are adjacent to one another. In some embodiments, the second light-emitting unit 10*b* and the third light-emitting unit 10*c* have a structure similar to that of the first light-emitting unit 10*a*. In addition, although the first light-emitting unit 10*a*, the second light-emitting unit 10*b* and the third light-emitting unit 10*c* are illustrated as having similar features, this is merely exemplary and not intended to limit these embodiments. The first light-emitting unit 10*a*, the second light-emitting unit 10*b* and the third light-emitting unit 10*c* may have similar structures or different structures to meet desired functional requirements.

The first light-emitting unit 10*a*, the second light-emitting unit 10*b* and the third light-emitting unit 10*c* may be different from one another at least in the thickness of the organic light-emitting stack layer. In some embodiments, the first light-emitting unit 10*a* emits green light, the second light-emitting unit 10*b* emits red light, and the third light-emitting unit 10*c* emits blue light.

In some embodiments, the light-emitting units 10*a*, 10*b*, 10*c* are configured to be divided into at least three different groups, wherein each group emits a different color than the other groups. The thickness of each organic light-emitting stack layer may be related to the color displayed by the corresponding light-emitting unit 10*a*, 10*b*, 10*c*. In some embodiments, the first light-emitting unit 10_a_ emits green light compared to other light-emitting units configured to emit a different color, and the organic light-emitting stack layer of the first light-emitting unit 10_a_ may have a minimum thickness. In some embodiments, compared with other light-emitting units configured to emit different colors, the second light-emitting unit 10_b_ emits red light, and the thickness of the organic light-emitting stack layer in the second light-emitting unit 10_b_ may be between the thickness of the organic light-emitting stack layer in the first light-emitting unit 10_a_ and the thickness of the organic light-emitting stack layer in the third light-emitting unit 10_c_. In some embodiments, the third light-emitting unit 10_c_ emits blue light compared to other light-emitting units configured to emit different colors, and the organic light-emitting stack layer of the third light-emitting unit 10_c_ may have a maximum thickness. The organic light-emitting stack layers of the first light-emitting unit 10_a_, the second light-emitting unit 10_b_ and the third light-emitting unit 10_c_ may be formed through various processes such as vapor deposition, liquid jetting or inkjet printing.

In some embodiments, the first, second and third light-emitting units 10_a_, 10_b_, 10_c_ may differ from one another at least in the thickness difference of the carrier transport layer of the first, second and third light-emitting units 10_a_, 10_b_, 10_c_.

In some embodiments, the light-emitting units 10_a_, 10_b_, 10_c_ are configured to be divided into at least three different groups, wherein each group emits a different color than the other groups. The thickness of the carrier transport layer can be correlated to the color displayed by the respective light-emitting unit 10_a_. In some embodiments, the first light-emitting unit 10_a_ emits green light compared to other light-emitting units configured to emit a different color, and the carrier transport layer of the first light-emitting unit 10_a_ may have a minimum thickness. In some embodiments, the second light-emitting unit 10_b_ emits red light compared to other light-emitting units configured to emit a different color, and the thickness of the carrier transport layer in the second light-emitting unit 10_b_ may be between the thickness of the carrier transport layer in the first light-emitting unit 10_a_ and the thickness of the carrier transport layer in the third light-emitting unit 10_c_. In some embodiments, the third light-emitting unit 10_c_ emits blue light compared to other light-emitting units configured to emit a different color, and the carrier transport layer of the third light-emitting unit 10_c_ may have a maximum thickness.

FIG. 3A to FIG. 3K depict a method of manufacturing a light-emitting element according to an embodiment.

Figure 3A:
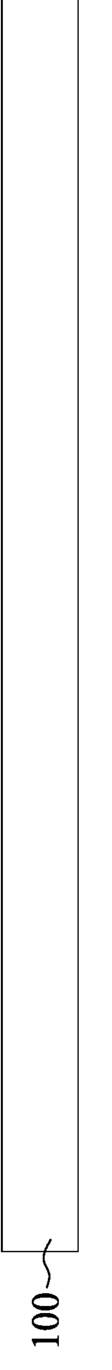
FIG. 3A to FIG. 3K depict a process of manufacturing a light-emitting element according to an embodiment.

In FIG. 3A, a substrate 100 is provided.

Figure 3B:
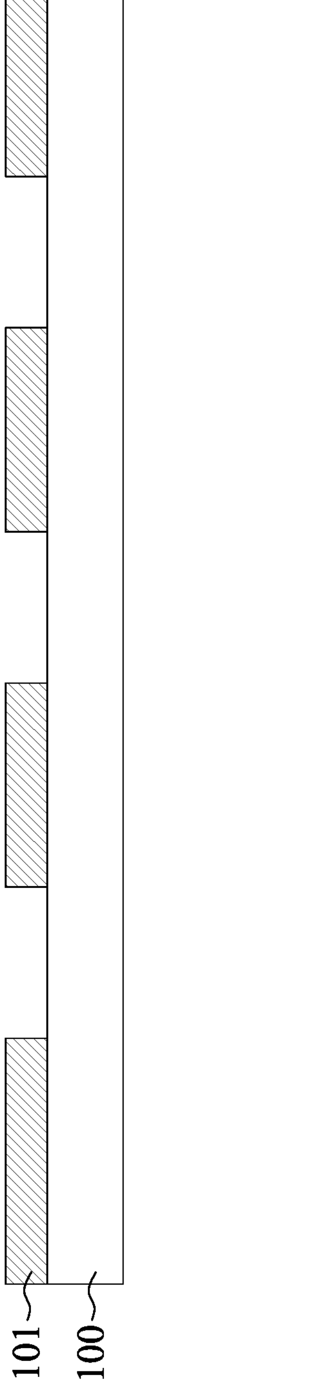

In FIG. 3B, a plurality of light shielding layers 101 is disposed on the substrate 100. Each light shielding layer 101 is arranged on the same side of the substrate. The respective light shielding layers 101 are separated from one another.

Figure 3C:
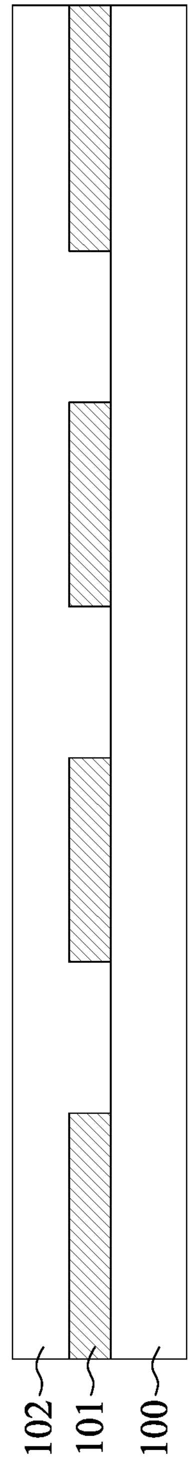

In FIG. 3C, a capping layer 102 is disposed on each light shielding layer 101. The capping layer 102 surrounds the upper surface and two side surfaces of each of the plurality of light shielding layers 101. The capping layer 102 is in contact with the substrate. The capping layer 102 is formed on the plurality of light shielding layers 101 through one of chemical vapor deposition (CVD), physical vapor deposition (PVD) and spin-on-glass (SOG) spin coating.

Figure 3D:
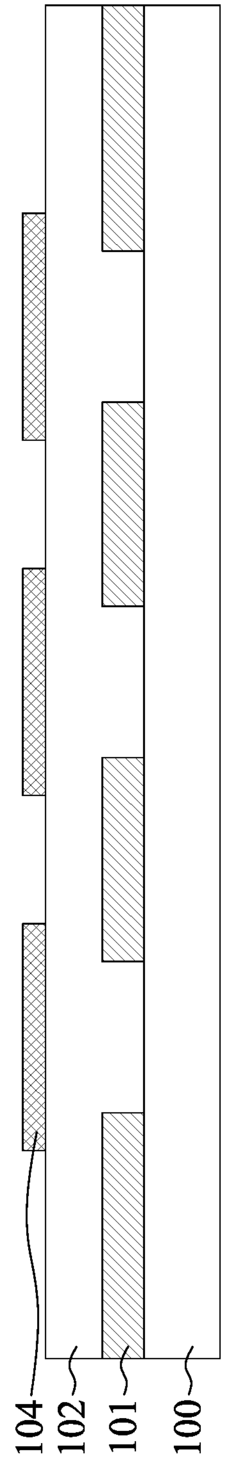

In FIG. 3D, a plurality of first electrodes 104 is disposed on the capping layer 102. Each first electrode 104 is configured to be electrically connected to the substrate 100. The array pattern of the first electrodes 104 is designed in consideration of the arrangement of pixels.

Figure 3E:
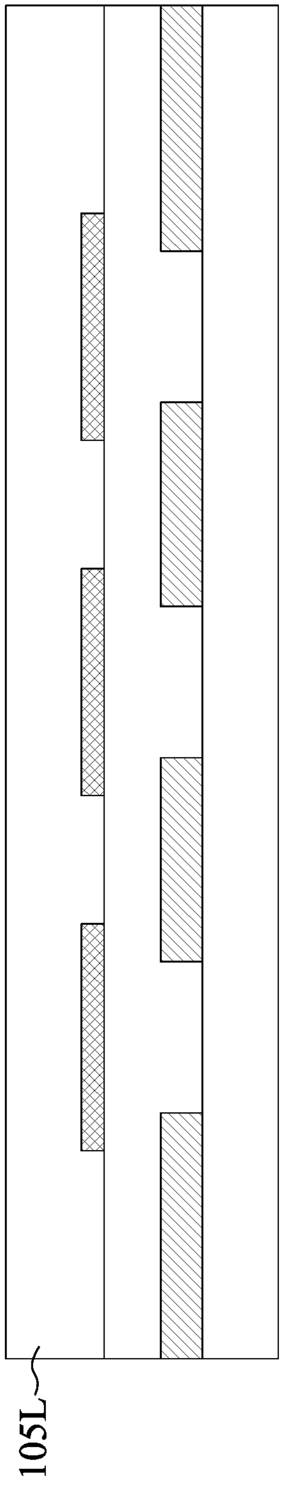

In FIG. 3E, a photosensitive layer 105L is provided on the first electrode 104. In some embodiments, the photosensitive layer 105L is coated on the first electrode 104 and the capping layer 102. The photosensitive layer 105L fills in the gap between adjacent first electrodes 104. The photosensitive layer 105L is heated to a predetermined temperature and then exposed to a specified wavelength. The photosensitive layer 105L can absorb more than 90% of visible light. After exposure, the photosensitive layer 105L is wetted in a solution for development.

Figure 3F:
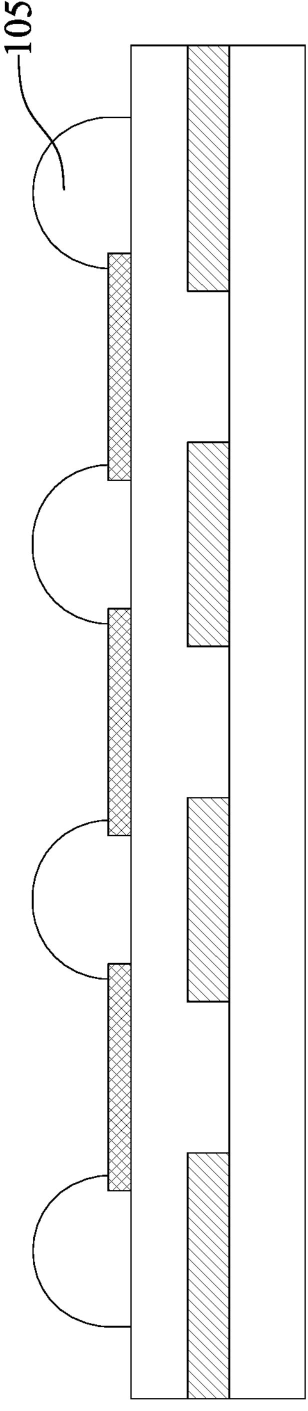

As shown in FIG. 3F, a portion of the photosensitive layer 105L is removed, and the remaining portion partially covers the gap between adjacent first electrodes 104. In this cross-sectional view, the remaining photosensitive layer 105L forms a plurality of protrusions 105, each protrusion 105 being formed on part of the upper surface of the first electrode 104 and covers one side surface of the first electrode 104. The protrusions 105 partially cover the respective first electrodes 104.

The protrusions 105 may be formed in different shapes. In FIG. 3F, the protrusion 105 has a curved surface. In some embodiments, the protrusion 105 is trapezoidal in shape. After the protrusions 105 are formed, a cleaning operation is performed to clean the exposed surfaces of the protrusions 105 and the first electrodes 104. In one embodiment, the deionized water is heated to a temperature between 30° C. and 80° C. during the cleaning operation. After the temperature of the deionized water is raised to a predetermined temperature, the deionized water is introduced to the exposed surfaces of the protrusions 105 and the first electrodes 104.

In some embodiments, ultrasound is used during the cleaning operation. Ultrasound is introduced into a cleaning agent (such as water or isopropyl alcohol (IPA), etc.). In some embodiments, carbon dioxide is introduced into the cleaning agent. After the cleaning operation, the cleaning agent is removed from the exposed surfaces through a heating operation. During the heating operation, the substrate 100 and protrusions 105 may be heated to a temperature between 80° C. and 110° C. In some instances, compressed air is directed to the exposed surface to help remove the residue of the cleaning agent while heating.

After the heating operation, the exposed surfaces can be treated with $O_2$, $N_2$, or Ar plasma. Plasma is used to roughen the exposed surfaces. In some embodiments, ozone is used to condition the surface state of the exposed surfaces.

Figure 3G:
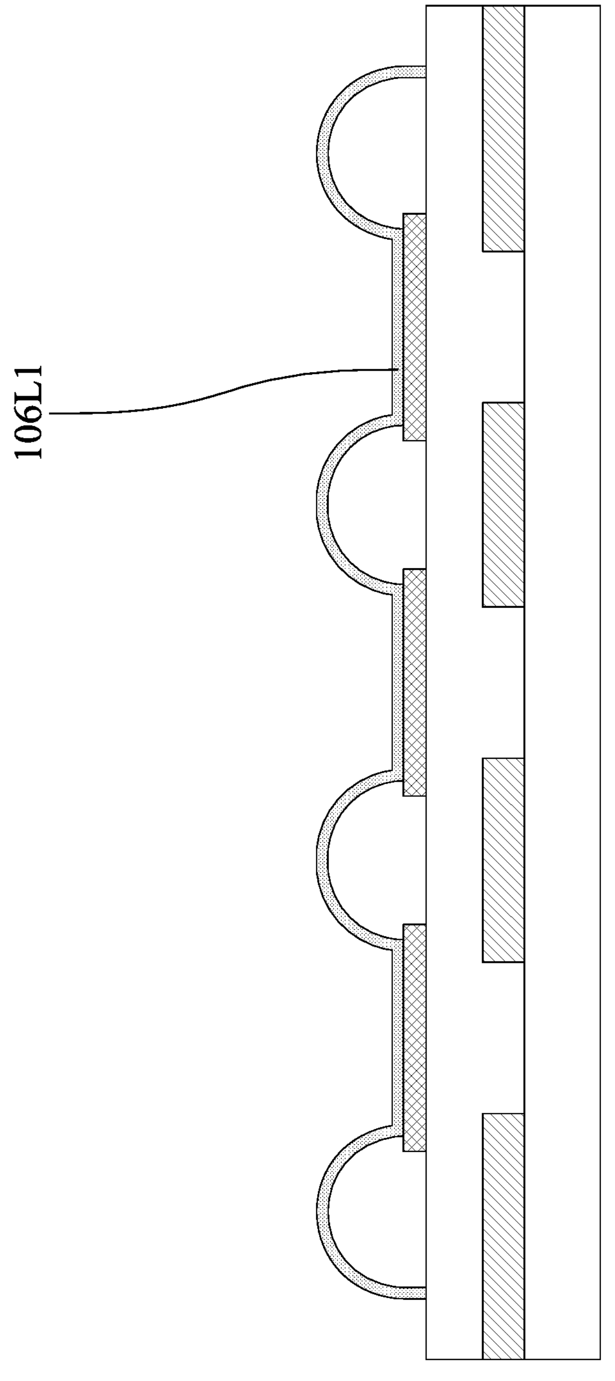

As shown in FIG. 3G, the carrier injection layer 106L1 is disposed on the protrusion 105, a part of the exposed surface of the capping layer 102 and the exposed surface of the first electrode 104. The carrier injection layer 106L1 is continuously lining along the exposed surface. More specifically, the exposed surface of each first electrode 104 is configured as an effective light-emitting area of a light-emitting unit (i.e., a pixel). In this embodiment, all light-emitting units use the carrier injection layer 106L1. In some embodiments, the carrier injection layer 106L1 is used for hole injection. In some embodiments, the carrier injection layer 106L1 is used for electron injection. The carrier injection layer 106L1 continuously covers the exposed surfaces of the plurality of protrusions 105 and the first electrodes 104. Optionally, the carrier injection layer 106L1 is in contact with the protrusion 105. In one embodiment, the carrier injection layer 106L1 is in contact with the first electrode 104. In some embodiments, the carrier injection layer 106L1 is organic.

Figure 3H:
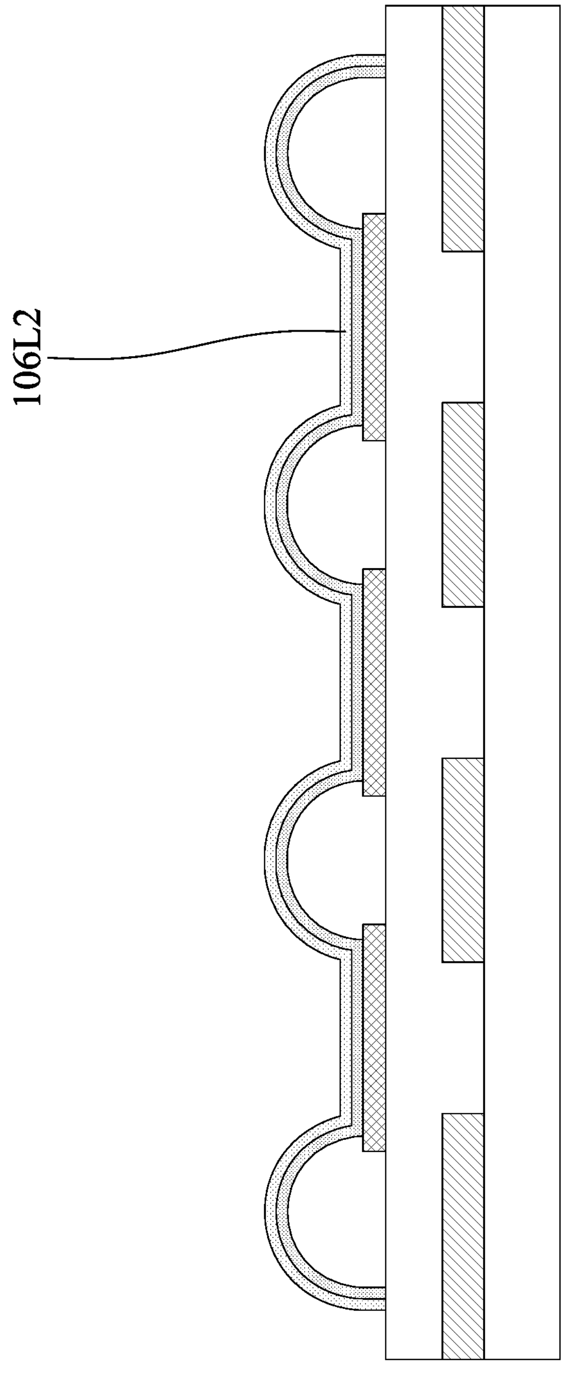

As shown in FIG. 3H, a carrier transport layer 106L2 is disposed on the protrusion 105, a part of the exposed surface of the capping layer 102 and the exposed surface of the first electrode 104. The carrier injection layer 106L1 is disposed below the carrier transport layer 106L2. The carrier transport layer 106L2 is continuously lining along the carrier injection layer 106L1. In this embodiment, all the light-emitting units use the carrier transport layer 106L2. In some embodiments, the carrier transport layer 106L2 is used for hole injection. In some embodiments, the carrier transport layer 106L2 is used for electron injection. The carrier transport layer 106L2 continuously covers the plurality of protrusions 105 and the first electrodes 104. Optionally, the carrier transport layer 106L2 is in contact with the carrier injection layer 106L1. In some embodiments, the carrier transport layer 106L2 is organic.

Figure 3I:
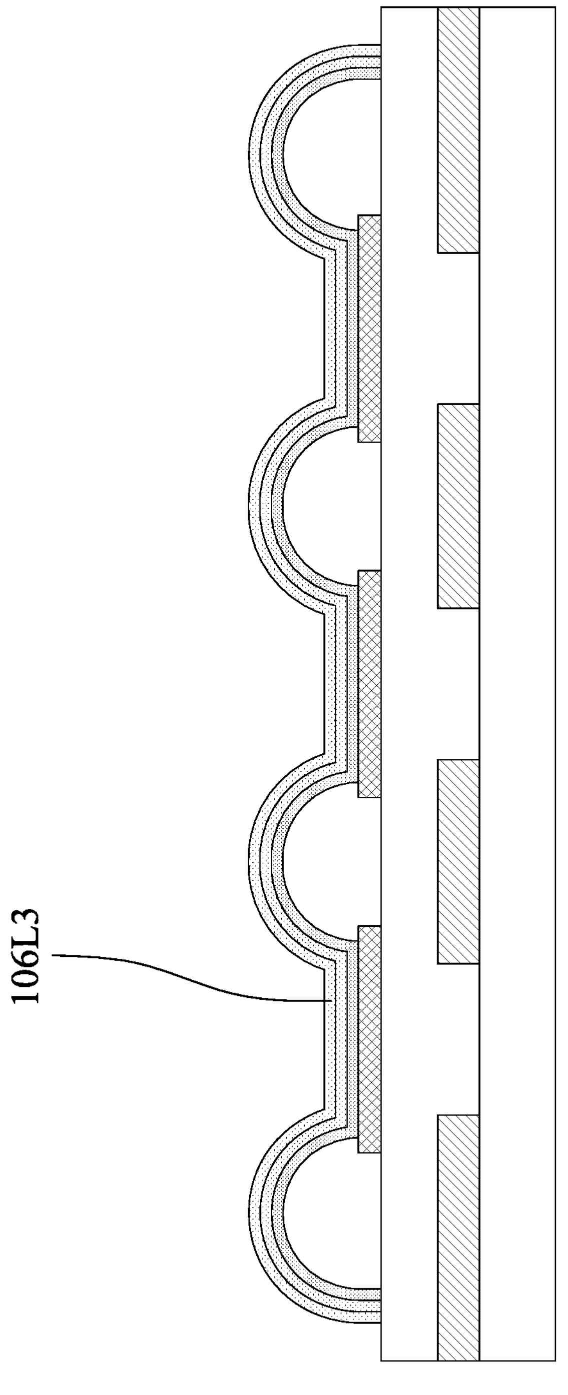

In FIG. 3I, the organic emission layer 106L3 is disposed on the protrusion 105, a portion of the exposed surface of the capping layer 102 and the exposed surface of the first electrode 104. The organic emission layer 106L3 covers the carrier transport layer 106L2. The organic emission layer 106L3 completely covers the exposed carrier transport layer 106L2. The organic emission layer 106L3 is configured to emit a first color.

Figure 3J:
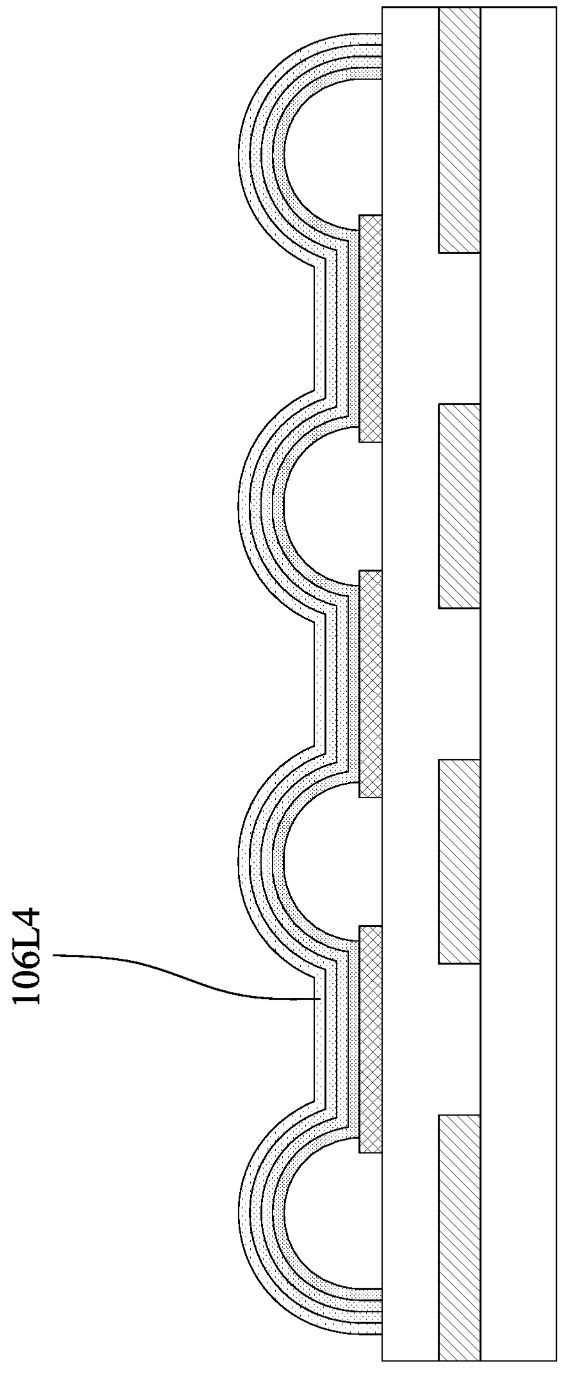

As shown in FIG. 3J, an organic carrier transport layer 106L4 is disposed on the organic emission layer 106L3. The organic carrier transport layer 106L4 can be a hole or electron transport layer. In some embodiments, the organic carrier transport layer 106L4 and the carrier transport layer 106L2 are respectively configured in opposite valence states.

Figure 3K:
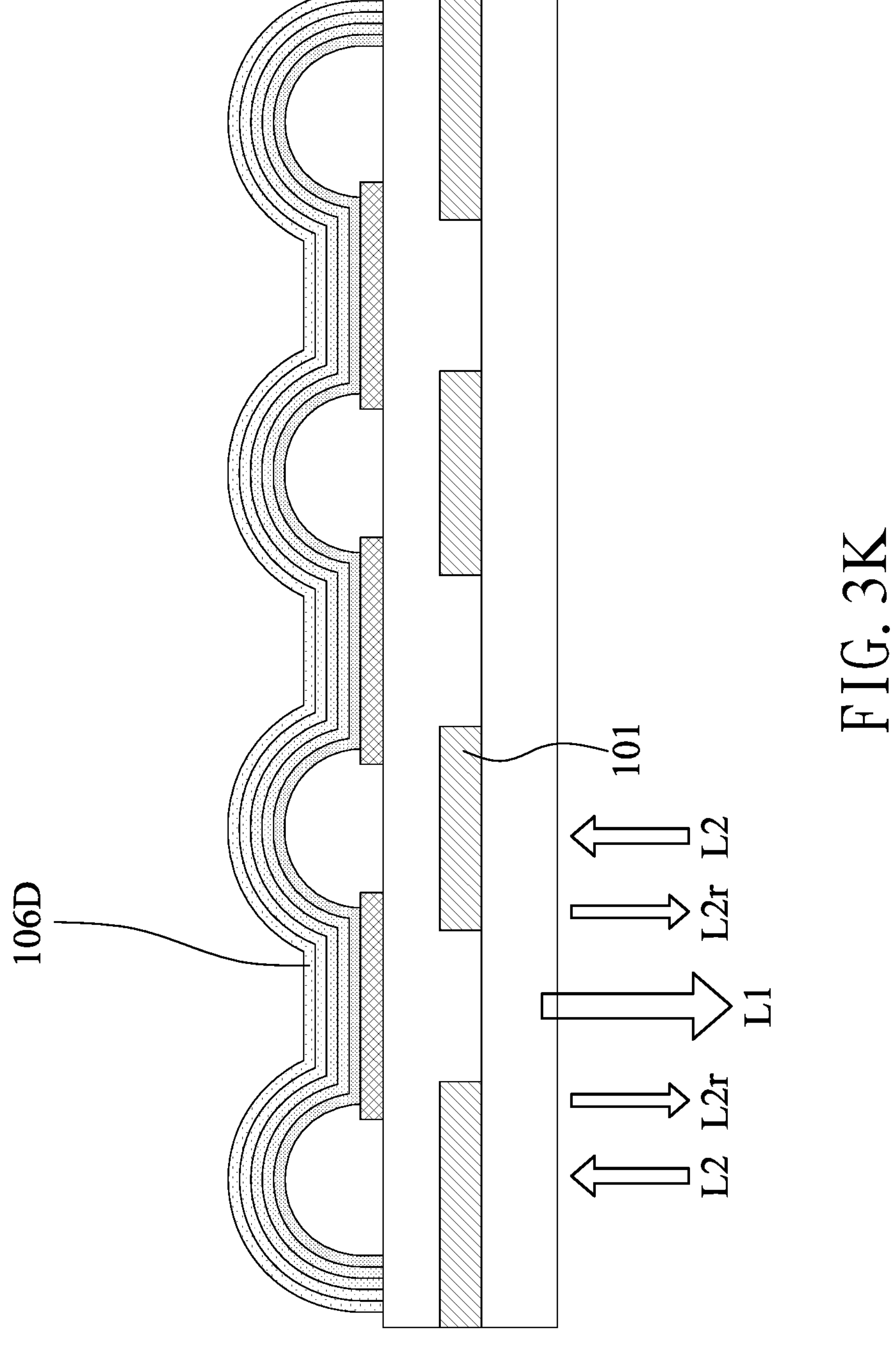

In FIG. 3K, a second electrode 106D is disposed on the organic carrier transport layer 106L4. The second electrode 106D covers the organic carrier transport layer 106L4.

The second electrode 106D can be a metal material, such as Ag, Mg and the like. In some embodiments, the second electrode 106D includes ITO (indium tin oxide) or IZO (indium zinc oxide). In some embodiments, each light-emitting unit (i.e., pixel) has an independent second electrode 106D from a cross-sectional view.

The operations shown in FIG. 3A to FIG. 3K can be repeatedly performed to form light-emitting units of different colors.

As shown in FIG. 3K, the light L1 generated by the light-emitting unit can be emitted outwards towards the substrate, and the ambient light L2 has a component that travels towards the light-emitting unit. After the ambient light L2 enters the light-emitting unit, it will produce a different reflected light L2*r* due to various components in the light-emitting unit. The reflected light L2*r* may interfere with the light L1 generated by the light-emitting unit, thus causing problems such as halo and optical cross talk, resulting in an unsatisfactory optical effect of the organic light-emitting display. According to the light shielding layer 101 of the present disclosure, through proper configuration (for example, using the above discussion to shield the ambient light), the interference of the ambient light L2 and the reflected light L2*r* on the light L1 can be greatly reduced, thereby solving problems such as halo and optical cross talk, and improving the contrast of the light-emitting unit.

Figure 4B:
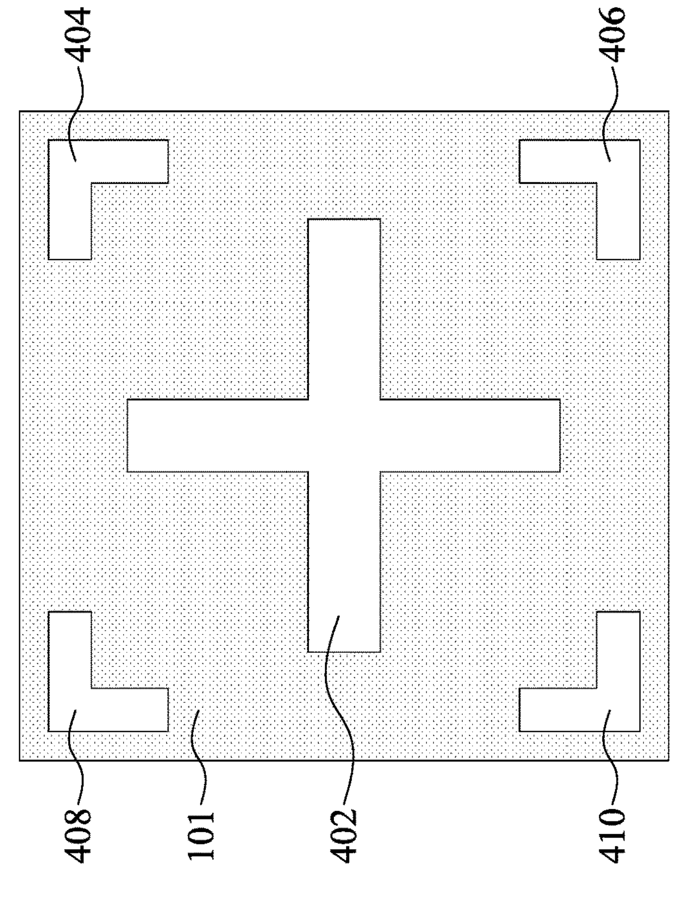
FIG. 4A and FIG. 4B depict top views of a light shielding layer according to an embodiment.
Figure 4A:
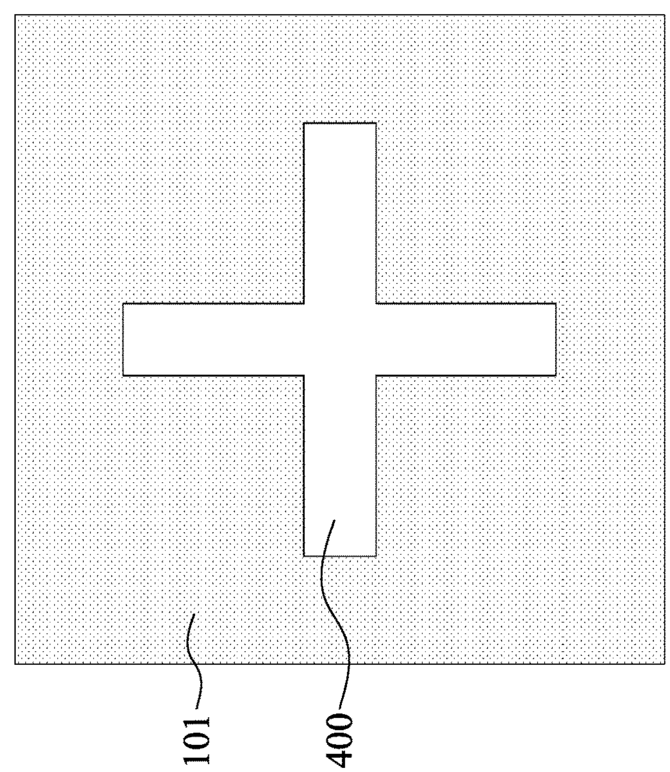

Referring to FIG. 4A, in some embodiments, the light shielding layer 101 may have a depression 400 (which may correspond to the W1 portion marked in FIG. 2) exhibiting a cross-shaped profile from a top view. The cross-shaped profile 400 allows the light emitted by the light-emitting unit (e.g. 10*a*, 10*b* or 10*c*) to pass through. In some embodiments, the cross-shaped profile 400 allows the light emitted by a single light-emitting unit to pass through. In some embodiments, the cross-shaped profile 400 allows the light emitted by the plurality of light-emitting units to pass through.

Referring to FIG. 4B, in some embodiments, the light shielding layer 101 may include a first depression 402 and second depressions 404, 406, 408, 410. The first depression 402 has a cross-shaped profile; the second depressions 404, 406, 408, 410 are located on four sides of the first depression 402, and have an L-shaped profile, so that the first depression 402 and the second depressions 404, 406, 408, 410 together form a crosshair pattern. The crosshair pattern can allow the light emitted by the light-emitting unit (for example 10*a*, 10*b* or 10*c*) to pass through. In some embodiments, the first depression 402 may overlap with the effective light-emitting area of the single light-emitting unit, allowing the light emitted by the single light-emitting unit to pass through. In some embodiments, the first depression 402 may overlap with the effective light-emitting area of the plurality of light-emitting units, allowing the light emitted by the plurality of light-emitting units to pass through. In some embodiments, each of the second depressions 404, 406, 408, 410 may overlap with the effective light-emitting area of a single light-emitting unit, each allowing the light emitted by the single light-emitting unit to pass through. In some embodiments, each of the second depressions 404, 406, 408, 410 may overlap with the effective light-emitting area of the plurality of light-emitting units, allowing the light emitted by the plurality of light-emitting units to pass through.

In some embodiments, the first depression 402 and the second depressions 404, 406, 408, 410 may overlap with the effective light-emitting area of a single light-emitting unit, allowing the light emitted by the single light-emitting unit to pass through. In some embodiments, the first depression 402 and the second depressions 404, 406, 408, 410 can overlap with the effective light-emitting areas of a plurality of light-emitting units, so that the light emitted by the plurality of light-emitting units can pass through.

The present application can adjust the patterning into a desired shape according to actual needs.

The foregoing content outlines the features of some implementations so that those skilled in the art may understand various aspects of the disclosure better. Those skilled in the art should understand that the present disclosure can be easily used as a basis for designing or modifying other processes and structures to reach the same purpose and/or achieve the same advantages as the embodiments described in this application. Those skilled in the art should also understand that this equal configuration does not depart from the spirit and scope of the disclosure, and those skilled in the art can make various changes, substitutions and replacements without departing from the spirit and scope of the disclosure.

What is claimed is:

1. A light-emitting element, comprising:

a substrate;

light shielding layers disposed over the substrate;

a capping layer disposed over the light shielding layers;

a plurality of protrusions arranged over the substrate and absent from the capping layer, an organic light-emitting unit comprising an organic material being disposed between two adjacent protrusions of the plurality of protrusions, wherein an edge of the light shielding layer is misaligned with an edge of one of the plurality of protrusions;

wherein the organic light-emitting unit includes a first light-emitting unit and a second light-emitting unit, wherein the first light-emitting unit and the second light-emitting unit respectively have an organic light-emitting stack layer containing the organic material, and wherein the light shielding layers are electrically insulated from the plurality of protrusions.

2. The light-emitting element of claim 1, wherein the organic light-emitting material includes a molecular structure with a resonance structure and can be selected from the group consisting of a spiro-triarylamine, a bis-triarylamine and a combination thereof.

3. The light-emitting element of claim 1, wherein the first light-emitting unit and the second light-emitting unit each have an effective light-emitting area whose size is defined by an anode located under the first light-emitting unit and the second light-emitting unit, each of the first light-emitting unit and the second light-emitting unit having a black area and a bright area when emitting light, wherein a total area of the black area of the first light-emitting unit and the second light-emitting unit is less than 50% of the effective light-emitting area of the first light-emitting unit and the second light-emitting unit.

4. The light-emitting element of claim 1, wherein the light shielding layer is electrically insulated from the conductive layer disposed on the capping layer by the capping layer.

5. The light-emitting element of claim 1, wherein the organic light-emitting stack layer includes:

a carrier injection layer;

a carrier transport layer;

an organic emission layer; and an organic carrier transport layer.

6. The light-emitting element of claim 1, wherein the plurality of protrusions comprises a photosensitive material.

7. The light-emitting element of claim 1, wherein the substrate comprises a transparent material.

8. A light-emitting element, comprising:

a substrate;

a plurality of light shielding layers disposed over the substrate;

a capping layer disposed over the substrate and covering the plurality of light shielding layers;

a conductive layer disposed over the capping layer;

a plurality of protrusions, wherein the plurality of protrusions is arranged over a portion of the conductive layer and absent from the capping layer, and an organic light-emitting unit comprising an organic material is disposed between two adjacent protrusions of the plurality of protrusions;

wherein each of the plurality of protrusions has an edge, which is offset from an edge of one of the plurality of light shielding layers in the longitudinal direction, and wherein the plurality of light shielding layers are electrically insulated from the plurality of protrusions.

9. The light-emitting element of claim 8, wherein a width of the light shielding layer is larger than a width of each of the plurality of protrusions in the lateral direction.

10. The light-emitting element of claim 8, wherein the conductive layer includes a transparent conductive film, and the transparent conductive film includes ITO (indium tin oxide), IZO (indium zinc oxide) or IGZO (indium gallium zinc oxide).

11. The light-emitting element of claim 8, wherein the conductive layer includes an anode electrode.

12. The light-emitting element of claim 8, wherein a distance between respective edges of the two adjacent protrusions is greater than a distance between two of the plurality of light shielding layers.

13. The light-emitting element of claim 8, wherein the capping layer is formed on the plurality of light shielding layers by one of chemical vapor deposition (CVD), physical vapor deposition (PVD) and spin-on-glass (SOG) spin coating.

* * * * *